US012810822B2

(12) United States Patent
Heo et al.

(10) Patent No.: US 12,810,822 B2
(45) Date of Patent: Nov. 24, 2026

(54) PHASE-LOCKED LOOP CIRCUIT AND DISPLAY DRIVER INCLUDING SAME

(71) Applicant: LX SEMICON CO., LTD., Daejeon (KR)

(72) Inventors: Hyun Woo Heo, Daejeon (KR); Jong Suk Lee, Daejeon (KR)

(73) Assignee: LX SEMICON CO., LTD., Daejeon (KR)

(*) Notice: Subject to any disclaimer, the term of this patent is extended or adjusted under 35 U.S.C. 154(b) by 0 days.

(21) Appl. No.: 19/013,734

(22) Filed: Jan. 8, 2025

(65) Prior Publication Data

US 2025/0225952 A1 Jul. 10, 2025

(30) Foreign Application Priority Data

Jan. 8, 2024 (KR) ........................ 10-2024-0002712
Dec. 5, 2024 (KR) ........................ 10-2024-0179444

(51) Int. Cl.
*G09G 5/00* (2006.01)
*H03L 7/081* (2006.01)
*H03L 7/099* (2006.01)

(52) U.S. Cl.
CPC ............. *G09G 5/008* (2013.01); *H03L 7/081* (2013.01); *H03L 7/099* (2013.01); *G09G 2310/08* (2013.01)

(58) Field of Classification Search
CPC ...... G09G 5/008; G09G 2310/08; G09G 3/20; H03L 7/081; H03L 7/099; H03L 7/0995; H03L 7/10
See application file for complete search history.

(56) References Cited

U.S. PATENT DOCUMENTS

| | | | | |
|---|---|---|---|---|
| 10,044,357 B1 * | 8/2018 | Tseng | H03L 7/113 | |
| 11,171,658 B1 * | 11/2021 | Nakamura | H03L 1/022 | |
| 11,876,523 B1 * | 1/2024 | Zhang | H03M 1/0854 | |
| 2008/0048904 A1 * | 2/2008 | Lee | H03L 7/0995 | 341/187 |
| 2009/0129524 A1 * | 5/2009 | Chen | H03L 7/081 | 375/376 |
| 2011/0063004 A1 * | 3/2011 | Chen | H03L 7/0995 | 327/157 |
| 2014/0320184 A1 * | 10/2014 | Chen | H03L 7/0891 | 327/156 |
| 2019/0131978 A1 * | 5/2019 | Sjoland | H03L 7/093 | |
| 2019/0207610 A1 * | 7/2019 | Rogers | H03L 7/087 | |
| 2022/0014205 A1 * | 1/2022 | Petrov | H03L 7/1974 | |

* cited by examiner

*Primary Examiner* — Bryan Earles
(74) *Attorney, Agent, or Firm* — POLSINELLI PC

(57) ABSTRACT

A phase-locked loop circuit includes a voltage-controlled oscillator configured to output a variable clock signal with an oscillation frequency based on a control voltage, and a bandwidth selection circuit configured to output a binary code value supplied to the voltage-controlled oscillator. The voltage-controlled oscillator outputs the variable clock signal based on a bandwidth selected according to the binary code value. Accordingly, the voltage-controlled oscillator may operate with a lower gain.

12 Claims, 7 Drawing Sheets

| Frequency comparator No. | $T_{delay}$ name | $T_{delay}$ |
|---|---|---|
| #1 | $T_{delay1}$ | 8*T |
| #2 | $T_{delay2}$ | 7*T |
| #3 | $T_{delay3}$ | 6*T |
| #4 | $T_{delay4}$ | 5*T |
| #5 | $T_{delay5}$ | 4*T |
| #6 | $T_{delay6}$ | 3*T |
| #7 | $T_{delay7}$ | 2*T |
| #8 | $T_{delay8}$ | 1*T |

| COMP_OUT | | | | | | | | BWMODE | | |
|---|---|---|---|---|---|---|---|---|---|---|
| <7> | <6> | <5> | <4> | <3> | <2> | <1> | <0> | <2> | <1> | <0> |
| 0 | 0 | 0 | 0 | 0 | 0 | 0 | 1 | 0 | 0 | 0 |
| 0 | 0 | 0 | 0 | 0 | 0 | 1 | 1 | 0 | 0 | 1 |
| 0 | 0 | 0 | 0 | 0 | 1 | 1 | 1 | 0 | 1 | 0 |
| 0 | 0 | 0 | 0 | 1 | 1 | 1 | 1 | 0 | 1 | 1 |
| 0 | 0 | 0 | 1 | 1 | 1 | 1 | 1 | 1 | 0 | 0 |
| 0 | 0 | 1 | 1 | 1 | 1 | 1 | 1 | 1 | 0 | 1 |
| 0 | 1 | 1 | 1 | 1 | 1 | 1 | 1 | 1 | 1 | 0 |
| 1 | 1 | 1 | 1 | 1 | 1 | 1 | 1 | 1 | 1 | 1 |

PHASE-LOCKED LOOP CIRCUIT AND DISPLAY DRIVER INCLUDING SAME

CROSS-REFERENCE TO RELATED APPLICATIONS

This application claims the priorities of Korean Patent Application No. 10-2024-0002712 filed on Jan. 8, 2024, and 10-2024-0179444 filed on Dec. 5, 2024, which are hereby incorporated by reference in their entirety.

BACKGROUND

Field of the Disclosure

The present disclosure relates to a phase-locked loop circuit and a display driver including the same, and more particularly, to a phase-locked loop circuit configured to output a clock signal based on a selected bandwidth and a display driver including the same.

Description of the Background

A display panel includes a plurality of pixels, and a desired image may be displayed by emitting light based on the current flowing through the light-emitting elements included in each pixel. To display a desired image through the display panel, a display device may convert image data input to a data processing device such as a timing controller T-CON into data of an appropriate format, for example, RGB data, and transmit it to a data driving circuit such as a source driver circuit SD-IC.

The data driving circuit may supply data voltages to the respective pixels of the display panel to drive each pixel based on the image data received from the data processing device. The data processing device may transmit signals based on a dedicated protocol, for example, clock embedded data signal CEDS, to a plurality of data driving circuits. The data driving circuit may restore a clock signal from the received signal and process the image data using the restored clock signal.

The data driving circuit may restore the clock signal through a restoration circuit. A phase-locked loop (PLL) circuit is an example of a circuit used in the restoration circuit. The phase-locked loop (PLL) circuit includes a voltage-controlled oscillator (VCO) that outputs a clock signal by varying the oscillation frequency according to a control voltage. To broaden the operating frequency range of the phase-locked loop (PLL) circuit, the gain Kvco of the voltage-controlled oscillator needs to be increased. However, in such a case, the output of the voltage-controlled oscillator becomes susceptible to instability, as even slight variations in the control voltage due to noise transmitted through the power supplied to the phase-locked loop (PLL) circuit may cause significant changes in the oscillation frequency. The operating frequency range of the phase-locked loop (PLL) circuit may be expanded by dividing the bandwidth into intervals, but this method has the drawback of requiring additional external pins to determine the bandwidth and requiring manual selection of the desired bandwidth. Additionally, the voltage-controlled oscillator has a characteristic where Kvco decreases at high control voltage ranges, leading to problems where the oscillation frequency of the output signal does not properly reflect the control voltage in those ranges.

SUMMARY

The present disclosure is to provide a phase-locked loop circuit that outputs a clock signal based on a selected bandwidth, allowing the voltage-controlled oscillator to operate with a lower gain, and a display driver including the same.

A problem to be solved by aspects of the present disclosure is to provide a phase-locked loop circuit that selects a bandwidth according to a binary code value output from a bandwidth selection circuit, enabling the voltage-controlled oscillator to operate with a lower gain, and a display driver including the same.

A problem to be solved by aspects of the present disclosure is to provide a phase-locked loop circuit that generates two clock signals having a 1 unit interval (UI) phase difference using a reference clock signal, which is an input signal and automatically selects a bandwidth by associating the two clock signals and interval-specific delay times dividing frequency bands, as well as a display driver including the same.

The problems of the present disclosure are not limited to the problems mentioned above, and other problems not explicitly stated will be apparently understood to those skilled in the art from the descriptions provided below.

A phase-locked loop circuit according to one aspect of the present disclosure includes a voltage-controlled oscillator configured to output a variable clock signal with an oscillation frequency based on a control voltage, and a bandwidth selection circuit configured to output a binary code value supplied to the voltage-controlled oscillator, wherein the voltage-controlled oscillator outputs the variable clock signal based on the selected bandwidth determined by the binary code value.

In addition, the input signal of the phase-locked loop circuit may include a reference clock signal, the bandwidth selection circuit may include a delay-locked loop circuit, the delay-locked loop circuit locks an internal clock signal to the same frequency as the reference clock signal using the reference clock signal, the delay-locked loop circuit may output two clock signals having a 1 unit interval (UI) phase difference, and the binary code value may be determined based on these two clock signals.

In addition, the bandwidth selection circuit may further include a multi-band selector, and the two clock signals may include a first clock signal and a second clock signal, wherein the first clock signal leads the second clock signal in phase, the multi-band selector receives the two clock signals, divides a predetermined frequency band into a plurality of intervals, sets interval-specific delay times, and determines the binary code value by comparing a delay clock signal generated by applying the delay time for each interval to the first clock signal with the second clock signal.

In addition, the number of the plurality of intervals may be 2 raised to the power of n (n being a natural number), and the interval-specific delay times may be sequentially configured as multiples of the shortest delay time among the interval-specific delay times.

In addition, the multi-band selector may determine whether the delay clock signal is lagging behind the second clock signal for each interval, generate a thermometer code value based on the determination result, and convert the thermometer code value into the binary code value.

In addition, the multi-band selector may determine, for each interval, that the delay clock signal is 0 if the phase of the delay clock signal leads the phase of the second clock signal, and 1 if the phase of the delay clock signal lags behind the phase of the second clock signal.

A display driver according to one aspect of the present disclosure includes a phase-locked loop circuit configured to restore a clock signal based on a signal received from an external device, and a control logic circuit configured to process image data using the restored clock signal. The phase-locked loop circuit includes a voltage-controlled oscillator configured to output a variable clock signal with an oscillation frequency based on a control voltage, and a bandwidth selection circuit configured to output a binary code value supplied to the voltage-controlled oscillator, and the voltage-controlled oscillator generates the restored clock signal by outputting the variable clock signal based on the selected bandwidth determined by the binary code value.

Specific details of other aspects are included in the detailed description and drawings.

According to the aspects of the present disclosure, two clock signals with a 1 unit interval (UI) phase difference may be generated using the reference clock signal, which is the input signal of the phase-locked loop (PLL) circuit. By associating the two clock signals generated based on the reference clock signal with interval-specific delay times divided by frequency bands and calculating a code value used for selecting the frequency band, the operating bandwidth of the voltage-controlled oscillator (VCO) may be automatically selected.

Therefore, the operating frequency band of the phase-locked loop (PLL) circuit may be broadened while keeping the gain Kvco of the voltage-controlled oscillator (VCO) (that is, the relationship between the control voltage and the oscillation frequency) at a low level. Additionally, the voltage-controlled oscillator (VCO) may have robust characteristics against noise transmitted through the power supply provided to the phase-locked loop circuit (PLL).

The effects of the present disclosure are not limited to the effects mentioned above, and other effects not explicitly stated will be apparently understood by those skilled in the art from the descriptions provided below.

BRIEF DESCRIPTION OF THE DRAWINGS

The above and other features and advantages of the present disclosure will become more apparent to those of ordinary skill in the art by describing exemplary aspects thereof in detail with reference to the attached drawings, in which.

DETAILED DESCRIPTION

Figure 1:
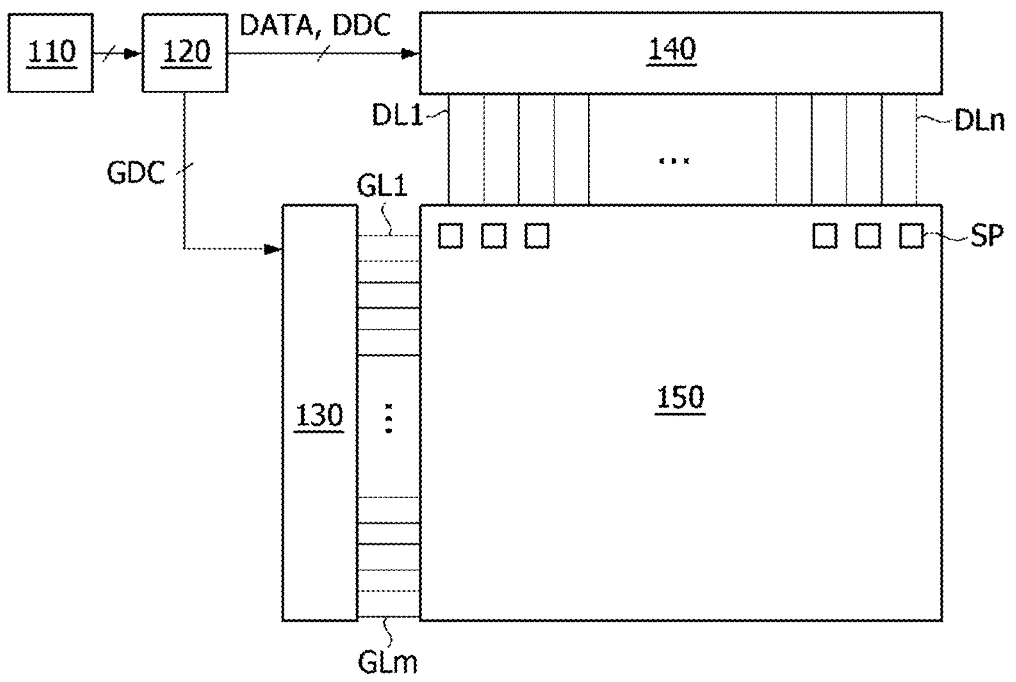
FIG. 1 is a block diagram of a display device according to one aspect of the present disclosure.

The advantages and features of the present disclosure, and methods of achieving them will be apparent from the aspects described in detail below in conjunction with the accompanying drawings. However, the present disclosure is not limited to the following aspects, but may be implemented in various different forms; rather, the present aspects are provided to make the description of the present disclosure complete and to allow those skilled in the art to fully understand the scope of the present disclosure, and the present disclosure is defined only within the scope of the appended claims.

The shapes, sizes, proportions, angles, numbers and the like shown in the accompanying drawings for the purpose of illustrating the aspects of the present disclosure are merely examples, and the present disclosure is not limited thereto. Identical reference numerals may designate identical components throughout the description. Further, in describing the present disclosure, detailed descriptions of known related technologies may be omitted if it is considered to unnecessarily obscure the gist of the present disclosure. The terms such as “including,” “having,” and “consisting of” used herein are generally intended to allow other components to be added unless the terms are used with the term “only.” References to components of a singular noun include the plural of that noun, unless specifically stated otherwise.

In interpreting components, they are construed to include a margin of error, even if it is not explicitly stated.

When describing a positional contextual relationship, for example, “on,” “above,” “below,” or “next to” describes the positional relationship of two parts, one or more other parts may be located between the two parts, unless “immediately” or “directly” is used.

When describing a temporal contextual relationship is described, for example, such as “after,” “following,” “next to,” or “before,” it may also include non-contiguous cases unless “immediately” or “directly” is used.

As used herein, the term “part” may refer to a unit that processes at least one function or operation, such as a software or hardware component. The functions provided by the “part” may be performed separately by multiple components, or it may be integrated with other additional components. In this disclosure, the “part” may be implemented in a single circuit or in a plurality of circuits, or in a single device or in a plurality of devices.

Each of the features of various aspects described herein may be coupled or combined with one another in whole or in part, and may be technologically interlocked and operated in various ways, and each of the aspects may be carried out independently or in conjunction with one another.

Hereinafter, the phase-locked loop circuit and the display driver including the same according to aspects of the present disclosure will be described with reference to the accompanying drawings.

FIG. 1 is a block diagram of a display device according to one aspect of the present disclosure.

As shown in FIG. 1, the display device according to one aspect of the present disclosure includes a host system 110, a timing controller 120, a gate driving circuit 130, a data driving circuit 140, and a display panel 150.

In one aspect, a display driver may include the timing controller 120, the gate driving circuit 130, and the data driving circuit 140. The timing controller 120, the gate driving circuit 130, and the data driving circuit 140 may be configured as separate chips or as individual chips including at least one of the timing controller 120, the gate driving circuit 130, and the data driving circuit 140.

The host system 110 processes image data signals and outputs them along with a vertical synchronization signal, a horizontal synchronization signal, a data enable signal, and a clock signal. The host system 110 supplies the vertical synchronization signal, horizontal synchronization signal, data enable signal, clock signal, and data signal to the timing controller 120.

The timing controller 120 receives the data signals and other signals from the host system 110 and outputs a gate timing control signal GDC to control the operation timing of the gate driving circuit 130 and a data timing control signal DDC to control the operation timing of the data driving circuit 140. The timing controller 120 supplies the data signal DATA to the data driving circuit 140 along with the data timing control signal DDC.

The timing controller 120 may transmit signals based on a dedicated protocol, such as a clock embedded data signal CEDS, to the data driving circuit 140.

The gate driving circuit 130 outputs a gate signal by shifting the level of the gate voltage in respond to the gate timing control signal GDC supplied from the timing controller 120. The gate driving circuit 130 includes a level shifter and a shift register.

The gate driving circuit 130 supplies gate signals to the sub-pixels SP included in the display panel 150 through gate lines GL1 to GLm. The gate driving circuit 130 may be formed as a gate in panel structure or in the form of an integrated circuit (IC) on the display panel 150. The portion of the gate driving circuit 130 that is implemented in the gate in panel structure, corresponds to the shift register.

The data driving circuit 140 samples and latches the data signal DATA in respond to the data timing control signal DDC supplied from the timing controller 120, and converts digital signals into analog signals corresponding to gamma voltages. The data driving circuit 140 supplies the data signal to the sub-pixels SP included in the display panel 150 through data lines DL1 to DLn. The data driving circuit 140 may include a plurality of source driver circuits, and each source driver circuit may be formed as an integrated circuit (IC).

The data driving circuit 140 may receive a clock embedded data signal CEDS from the timing controller 120, restore the clock signal from the received signal, and use the restored clock signal to process the image data.

The display panel 150 displays images in response to the gate signals and data signals output from the driving circuits including the gate driving circuit 130 and the data driving circuit 140. Depending on the substrate material, the display panel 150 may be implemented in flat, curved, or flexible forms. The display panel 150 includes a display area defined by a plurality of pixels and a non-display area where various signal wirings or pads are formed. In the display area of the display panel 150, a plurality of pixels are arranged, defined by the plurality of data lines DL1 to DLn and gate lines GL1 to GLm. Each pixel includes a plurality of sub-pixels SP. The sub-pixels SP may include red, green, and blue sub-pixels, or red, green, blue, and white sub-pixels. The sub-pixels SP may have one or more different emission areas depending on their emission characteristics.

The pixel array of the display panel 150 may include a plurality of horizontal pixel lines, with each horizontal pixel line comprising a plurality of pixels that are horizontally adjacent and commonly connected to gate lines. Here, each horizontal pixel line does not refer to a physical signal line but rather represents a block of one line of pixels implemented by the horizontally adjacent pixels.

Figure 2:
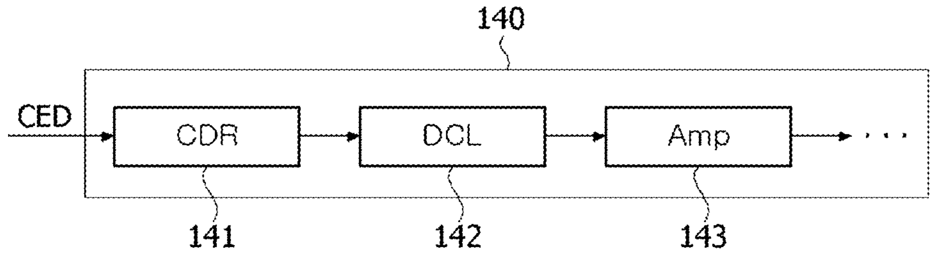
FIG. 2 is a block diagram of a source driver circuit according to one aspect of the present disclosure.

FIG. 2 is a block diagram of a source driver circuit according to one aspect of the present disclosure.

The source driver circuit 140 may include a clock and data recovery (CDR) circuit 141, a digital control logic (DCL) circuit 142, an amplifier circuit Amp 143, and internal circuits provided therein.

The clock and data recovery circuit 141 may receive clock embedded data (CED) and restore a clock signal based on the received data. In one aspect, a phase-locked loop (PLL) circuit may be used for clock signal recovery. The clock and data recovery circuit 141 may accurately reconstruct data by sampling the received data using the restored clock signal.

The digital control logic circuit 142 may process the digital image data restored by the clock and data recovery circuit 141. The signal processed in the control logic circuit 142 may, for example, be output to the amplifier circuit 143 and then delivered to the internal circuits.

Figure 3:
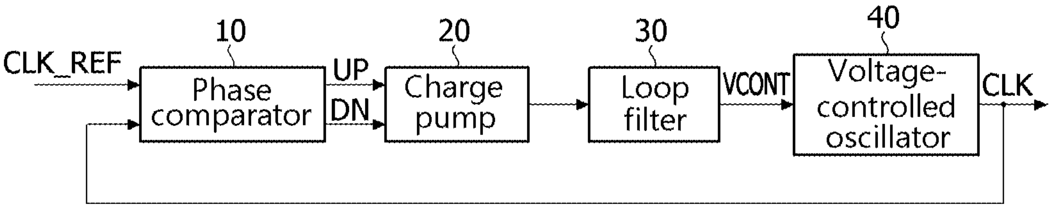
FIG. 3 is a block diagram of a phase-locked loop circuit according to a related art aspect.

FIG. 3 is a block diagram of a phase-locked loop circuit according to a related art aspect.

As shown in FIG. 3, a related art phase-locked loop (PLL) circuit may include a phase comparator 10, a charge pump 20, a loop filter 30, and a voltage-controlled oscillator 40.

The phase comparator 10 compares the phases and/or frequencies of the input reference clock signal CLK_REF and the output clock signal CLK. The charge pump 20 outputs a charging current or discharging current based on the comparison result UP/DN from the phase comparator 10. The loop filter 30 is charged or discharged by the charging or discharging current, thereby outputting a control voltage VCONT that varies accordingly. The voltage-controlled oscillator VCO 40 determines the oscillation frequency based on the control voltage VCONT and outputs a clock signal CLK with the corresponding frequency.

Therefore, the phase-locked loop (PLL) circuit may generate and output a stable clock signal CLK with a locked frequency by comparing the input reference clock signal CLK_REF with the output clock signal CLK.

Figure 4:
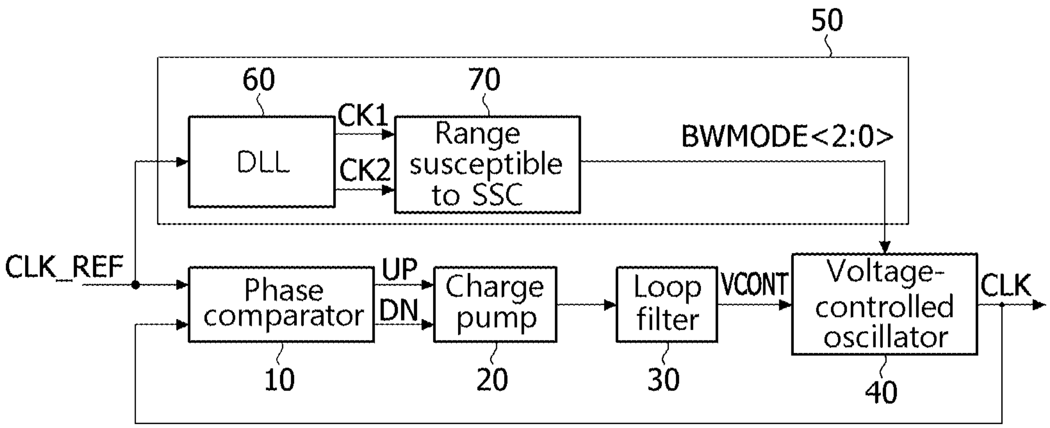
FIG. 4 is a block diagram of a phase-locked loop circuit according to one aspect of the present disclosure.

FIG. 4 is a block diagram of a phase-locked loop circuit according to one aspect of the present disclosure.

Referring to FIG. 4, a phase-locked loop (PLL) circuit according to one aspect of the present disclosure may further include a bandwidth selection circuit 50 compared to the related art PLL circuit shown in FIG. 3.

The bandwidth selection circuit 50 may receive the reference clock signal CLK_REF, which is the input signal of the PLL circuit, and output a binary code value, BWMODE<2:0>, to the voltage-controlled oscillator 40. The voltage-controlled oscillator 40 may receive the binary code value from the bandwidth selection circuit 50 and select the frequency band of the output clock signal CLK. In the selected frequency band based on the binary code value, the voltage-controlled oscillator 40 may output the clock signal CLK in accordance with the control voltage VCONT. In FIG. 4, the binary code value is represented as 3 bits <2:0>; however, it is not limited to this and may be set with different numbers of bits depending on the number of intervals dividing the selectable frequency bands.

In one aspect of the present disclosure, the bandwidth selection circuit 50 may include a delay-locked loop (DLL) circuit 60 and a multi-band selector 70.

The delay-locked loop (DLL) circuit 60 may receive the reference clock signal CLK_REF, which is the input signal of the phase-locked loop (PLL) circuit, and use it to lock an internal clock signal of the delay-locked loop (DLL) circuit 60 to the same frequency as the reference clock signal CLK_REF. The DLL circuit 60 may output two clock signals with a 1 unit interval (UI) phase difference to the multi-band selector 70.

The multi-band selector 70 may receive the two clock signals with a 1UI phase difference from the DLL circuit 60 and use them to generate a binary code value, BWMODE<2:0>. The generated binary code value is output and transmitted to the voltage-controlled oscillator 40.

The multi-band selector 70 may divide a predetermined frequency band, in which the voltage-controlled oscillator 40 operates to generate output signals, into a plurality of intervals, assign delay times to each interval, and generate a binary code value by associating the received two clock signals with a 1UI phase difference with the corresponding delay times and calculating the result.

Figure 5:
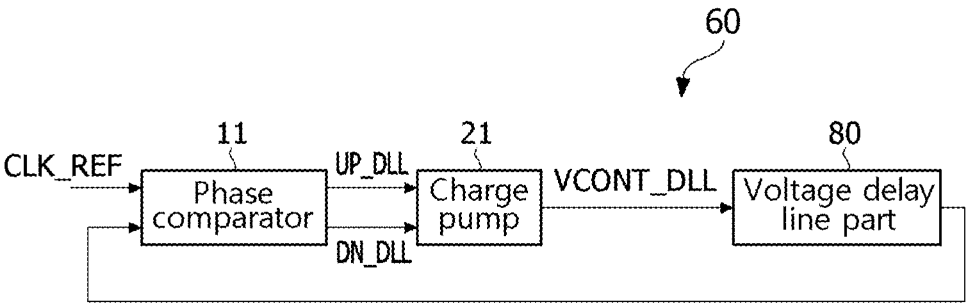
FIG. 5 is a block diagram of a delay-locked loop circuit included in a bandwidth selection circuit according to one aspect of the present disclosure.

FIG. 5 is a block diagram of the delay-locked loop circuit included in the bandwidth selection circuit according to one aspect of the present disclosure.

The delay-locked loop (DLL) circuit 60 according to one aspect of the present disclosure may include a phase comparator 11, a charge pump 21, and a voltage delay line part 80.

The phase comparator 11 compares the phase of the reference clock signal CLK_REF, which is the input signal of the phase-locked loop (PLL) circuit, with the phase of the feedback signal from the output of the DLL circuit 60. Based on whether the phase of the feedback signal leads or lags (i.e., is faster or slower) relative to the reference clock signal CLK_REF, the phase comparator 11 generates an UP_DLL or DN_DLL signal and transmits it to the charge pump 21.

The charge pump 21 may output a charging current or discharging current to charge or discharge a capacitor based on the comparison result from the phase comparator 10 to adjust the control voltage VCONT_DLL. In one aspect, the delay-locked loop (DLL) circuit 60 may include a loop filter (not shown), and the control voltage VCONT_DLL may be adjusted through charging or discharging in the loop filter.

The voltage delay line part 80 receives the control voltage VCONT_DLL and adjusts the delay of each delay cell to synchronize the phase of the reference clock signal CLK_REF with the feedback signal.

Figure 6:
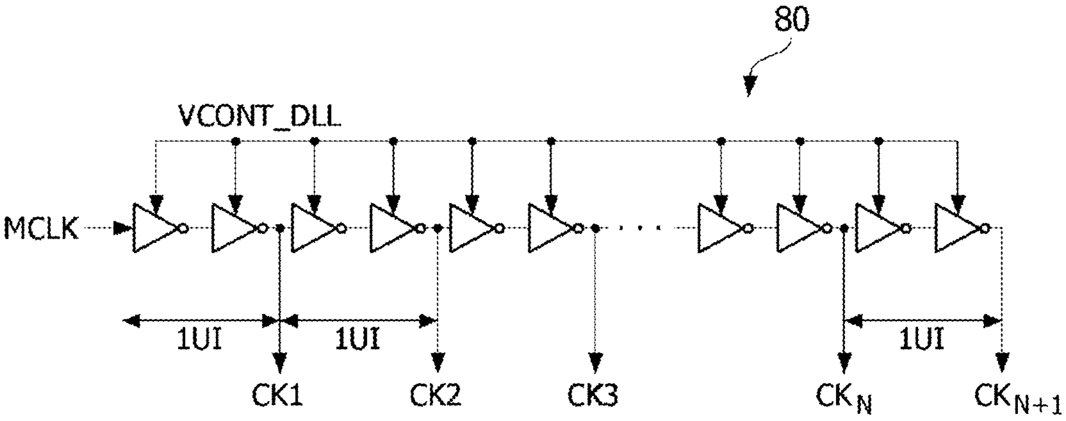
FIG. 6 is a circuit diagram of a voltage delay line part in the delay-locked loop circuit according to one aspect of the present disclosure.

FIG. 6 is a circuit diagram of the voltage delay line part of the delay-locked loop circuit according to one aspect of the present disclosure.

The voltage delay line part 80 receives the main clock signal MCLK, which is derived from the reference clock signal CLK_REF, the input signal of the phase-locked loop (PLL) circuit having a period of N-UI (where N is a natural number), after it passes through the phase comparator 11 and the charge pump 21. In one aspect, the voltage delay line part 80 may compare the phase of the main clock signal MCLK with the phase of one of the output clock signals, such as the CKN signal, which has an N-UI (N is a natural number) delay relative to the main clock signal MCLK. When the phases of the two clock signals are synchronized, the voltage delay line part 80 may generate multi-phase clock signals, each with a delay of 0.5 UI per delay cell (i.e., a phase difference of 0.5 UI).

Therefore, the voltage delay line part 80 in the DLL circuit 60 may extract two clock signals with a 1UI phase difference based on the reference clock signal CLK_REF, which is the input signal of the PLL circuit. The frequency band of the reference clock signal CLK_REF, which is the input signal of the PLL circuit, may then be determined based on the delay time between the two clock signals.

The two clock signals used to determine the frequency band of the reference clock signal CLK_REF only need to form a pair of the clock signals with a 1UI phase difference. For convenience of explanation, the two clock signals used in certain parts of the present disclosure are exemplified as the CK1 and CK2 clock signals, as shown in FIG. 6, but is not limited thereto.

Figure 7:
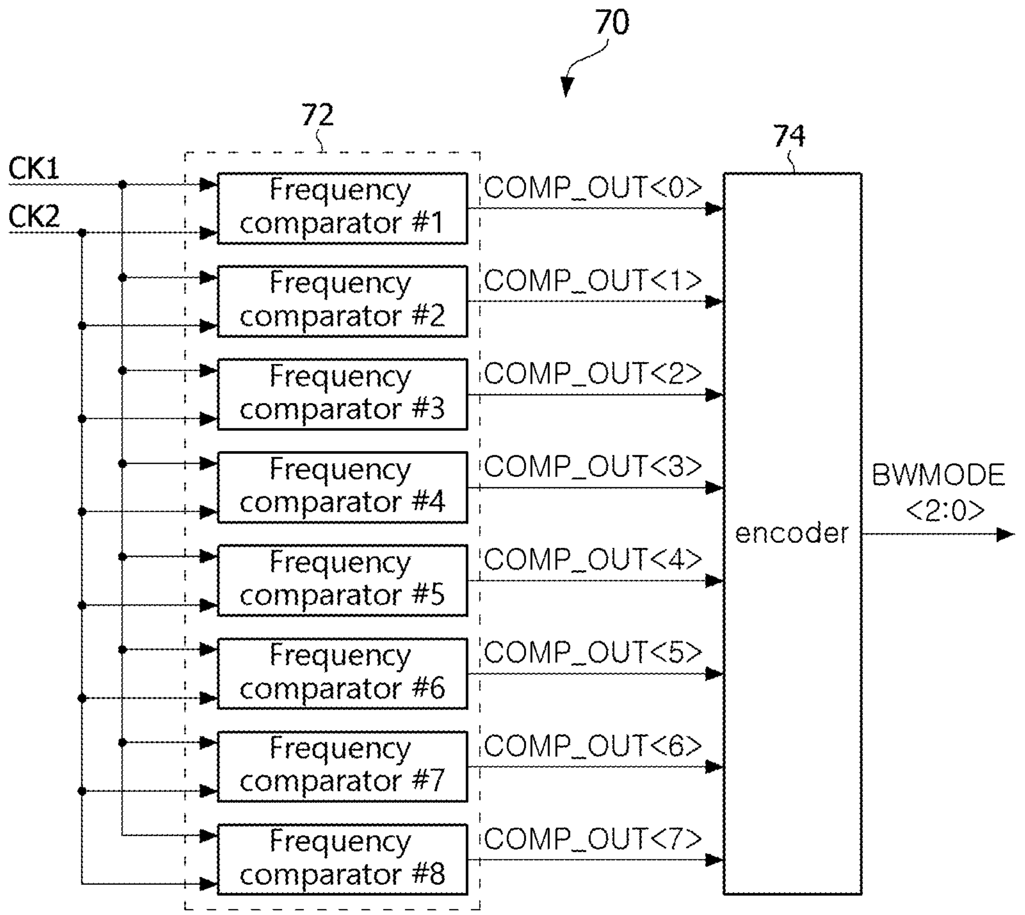
FIG. 7 is a block diagram of a multi-band selector included in a bandwidth selection circuit according to one aspect of the present disclosure.
Figure 8:
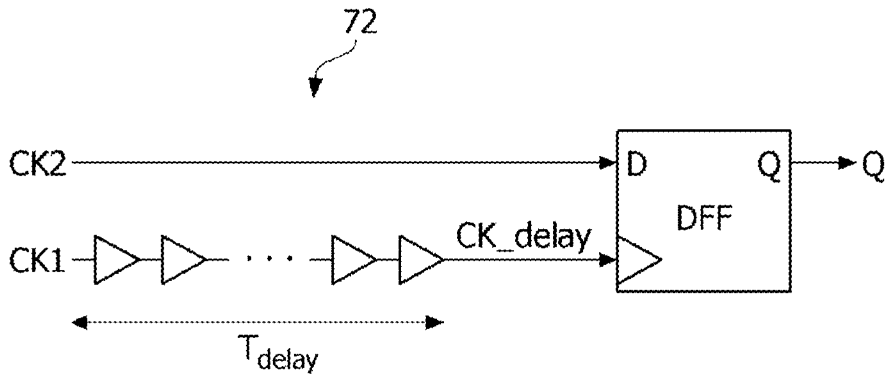
FIG. 8 is a circuit diagram of a frequency comparator included in the multi-band selector according to one aspect of the present disclosure.
Figures 9, 10:
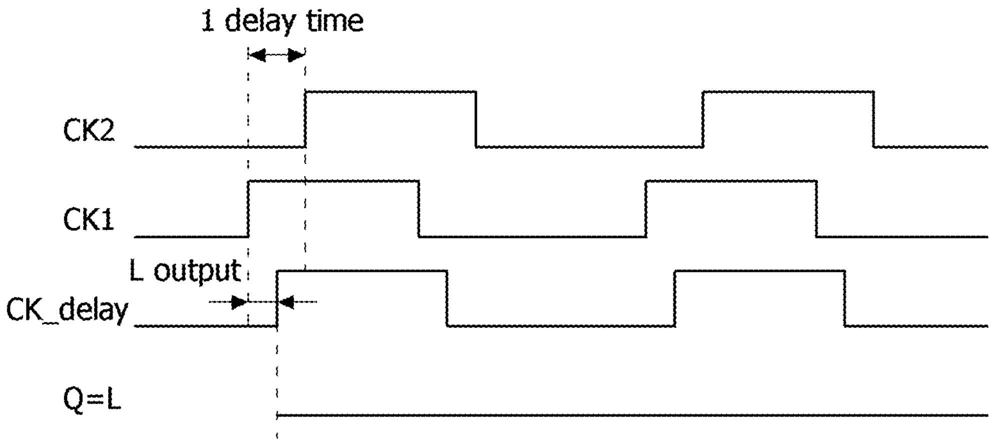
FIG. 9 is a table illustrating the delay times applied to each frequency comparator according to one aspect of the present disclosure.
FIGS. 10 and 11 are timing diagrams illustrating a method for computing a code value by comparing clock signals according to one aspect of the present disclosure.

FIG. 7 is a block diagram of a multi-band selector included in the bandwidth selection circuit according to one aspect of the present disclosure; FIG. 8 is a circuit diagram of a frequency comparator included in the multi-band selector; and FIG. 9 is a table showing the delay times applied to each frequency comparator.

The multi-band selector 70 receives two clock signals with a 1UI phase difference (e.g., clock signals CK1 and CK2) output from the delay-locked loop (DLL) circuit 60 and generates and outputs a binary code value, BWMODE<2:0>.

The multi-band selector 70 may divide a predetermined frequency band, in which the voltage-controlled oscillator 40 operates to generate output signals, into a plurality of intervals. It may assign delay times to each interval and generate the binary code value by associating the received two clock signals with a 1UI phase difference with the corresponding delay times and calculating the result.

More specifically, in one aspect, if the predetermined frequency band is divided into 8 intervals, different delay times may be assigned to each of the 8 intervals. Additionally, the two clock signals with a 1UI phase difference may include a first clock signal (e. g., CK1) that leads in phase (or is faster) and a second clock signal (e. g., CK2) that lags in phase (or is slower). The binary code value may be generated by applying a set delay time to the first clock time to generate a delay clock signal, and comparing the phase of the delay clock signal with that of the second clock signal to compute the code value.

The multi-band selector 70 according to one aspect of the present disclosure may include a plurality of frequency comparators 72 and an encoder 74.

In one aspect, the frequency comparator 72, configured as shown in FIG. 8, may generate a delay clock signal CK_delay by applying a set delay time Tdelay to the first clock signal (e.g., CK1). It may then compare the phase of the delay clock signal CK_delay with the second clock signal (e.g., CK2) and output an output signal Q based on the result of the comparison. In one aspect, the output signal through phase comparison of the clock signals may be output using a D flip-flop (DFF).

The frequency comparator 72 may be configured with a number corresponding to the number of intervals into which the predetermined frequency band is divided. For example, if the predetermined frequency band is divided into 8 intervals, the multi-band selector 70 may include 8 frequency comparators (#1 to #8), as shown in FIG. 7. In one aspect of the present disclosure, the number of intervals dividing the predetermined frequency band may be 2 raised to the power of n (n being a natural number). This configuration may be based on the binary code value to determine the number of intervals; however, the technical idea of the present disclosure is not limited to this specific method of determining the number of intervals.

Referring to FIGS. 7 and 9 together, the delay times Tdelay set for the 8 frequency comparators (#1 to #8) may differ and are represented as Tdelay1 to Tdelay8. In one aspect of the present disclosure, the delay times set for each frequency comparator 72 (#1 to #8) may be sequentially configured as multiples of the delay time T assigned to the frequency comparator with the shortest delay time, which is the 8th frequency comparator (#8). For instance, the 7th frequency comparator (#7) may have a delay time of 2T, the 6th frequency comparator (#6) may have a delay time of 3T, and in this manner, the 1st frequency comparator (#1) may have a delay time of 8T.

Referring to FIG. 8, each frequency comparator 72 (#1 to #8) receives the first and second clock signals (e.g., CK1 and CK2). Each frequency comparator individually applies an individually set delay time Tdelay to the first clock signal to generate a delay clock signal CK_delay. Each frequency comparator then compares the phase of the delay clock signal with the second clock signal and outputs an output signal Q based on the result of the comparison. For example, the first frequency comparator (#1) applies a delay time of 8T to the first clock signal to generate the delay clock signal and compares its phase with the second clock signal. Similarly, the eighth frequency comparator (#8) applies a delay time of T to the first clock signal to generate the delay clock signal and compares its phase with the second clock signal.

Figures 11, 12:
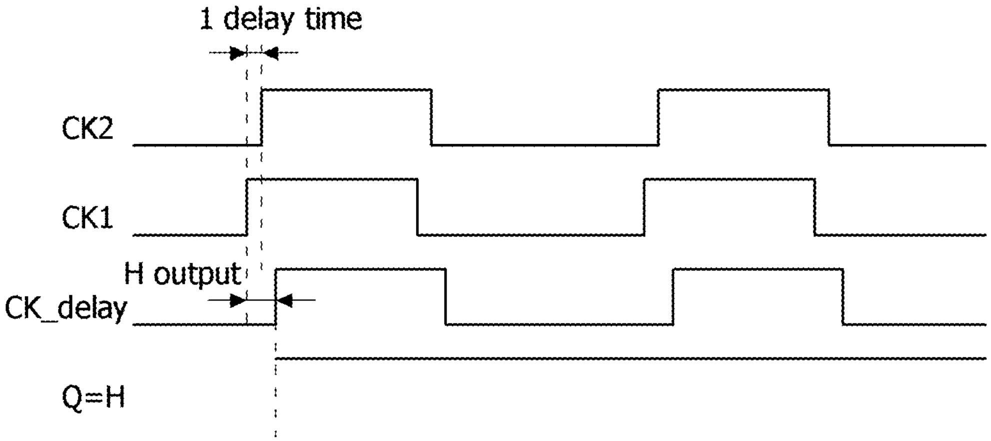
FIG. 12 is a table illustrating binary code values corresponding to thermometer code values according to one aspect of the present disclosure.

FIGS. 10 and 11 are timing diagrams illustrating a method for computing code values by comparing clock signals according to one aspect of the present disclosure.

Referring to FIG. 10, in a high-frequency band interval, a relatively short delay time (e.g., a delay time T, as shown in FIG. 9) is applied to the first clock signal CK1 to generate a delay clock signal CK_delay. This delay clock signal CK_delay is used to determine whether the second clock signal CK2 is at a high level. Specifically, whether the second clock signal CK2 is in has the high-level state is determined at the rising edge timing of the delay clock signal CK_delay. As shown in FIG. 10, the output signal Q of the corresponding frequency comparator 72 may be a low-level signal in this case.

Referring to FIG. 11, in a low-frequency band interval, a relatively long delay time (e.g., 8T, as shown in FIG. 9) is applied to the first clock signal CK1 to generate the delay clock signal CK_delay. This delay clock signal CK_delay is used to determine whether the second clock signal CK2 is at a high level. Specifically, whether the second clock signal CK2 is in the high-level state is determined at the rising edge timing of CK_delay. As shown in FIG. 11, the output signal Q of the corresponding frequency comparator 72 may be a high-level signal.

For example, if the frequency band from 1 Gbps to 8 Gbps is divided into 8 intervals, the delay time Tdelay for the 1 Gbps frequency interval may be set to 1 ns for a 1 UI delay, and the delay time Tdelay for the 8 Gbps frequency interval may be set to 0.125 ns for a 1 UI delay. To aid understanding, in the high-frequency interval of 8 Gbps, a relatively short delay time of 0.125 ns may be applied to generate the delay clock signal CK_delay. In contrast, in the low-frequency interval of 1 Gbps, a relatively long delay time of 1 ns may be applied to generate the delay clock signal CK_delay.

FIG. 12 is a table showing the binary code values corresponding to thermometer code values according to one aspect of the present disclosure.

The encoder 74 receives the output of each frequency comparator 72 as input signals, COMP_OUT<0> to COMP_OUT<7>, and generates a thermometer code value based on these inputs. The encoder 74 may generate the thermometer code value, COMP_OUT, to correspond to a value of 0 when receiving a low-level signal from a frequency comparator, and to correspond to a value of 1 when receiving a high-level signal, as shown in FIG. 12.

The encoder 74 may convert the generated thermometer code value, COMP_OUT, into a binary code value BWMODE. In one aspect of the present disclosure, the binary code value may be generated to correspond to the number of 1s in the thermometer code value minus 1. For example, if the thermometer code value has a value of 1 from COMP_OUT<0> to COMP_OUT<4> and a value of 0 from COMP_OUT<5> to COMP_OUT<7>, the total number of 1s is 5. Subtracting 1 from this total gives a value of 4, which corresponds to the binary code value. In this case, the binary code value would be BWMODE<100>.

The encoder 74 may output the generated binary code value BWMODE, and the output binary code value may be transmitted to the voltage-controlled oscillator 40 as option information, enabling the voltage-controlled oscillator 40 to operate within the frequency band corresponding to the binary code value.

Meanwhile, in one aspect of the present disclosure, the voltage-controlled oscillator 40 may receive the current and use a current-starved ring oscillator that increases the output frequency as the input current increases. A current source, which increases current in response to an increase in the control voltage VCONT and the binary code value BWMODE, may be applied to the ring oscillator to adjust the frequency of the output signal.

Figure 13:
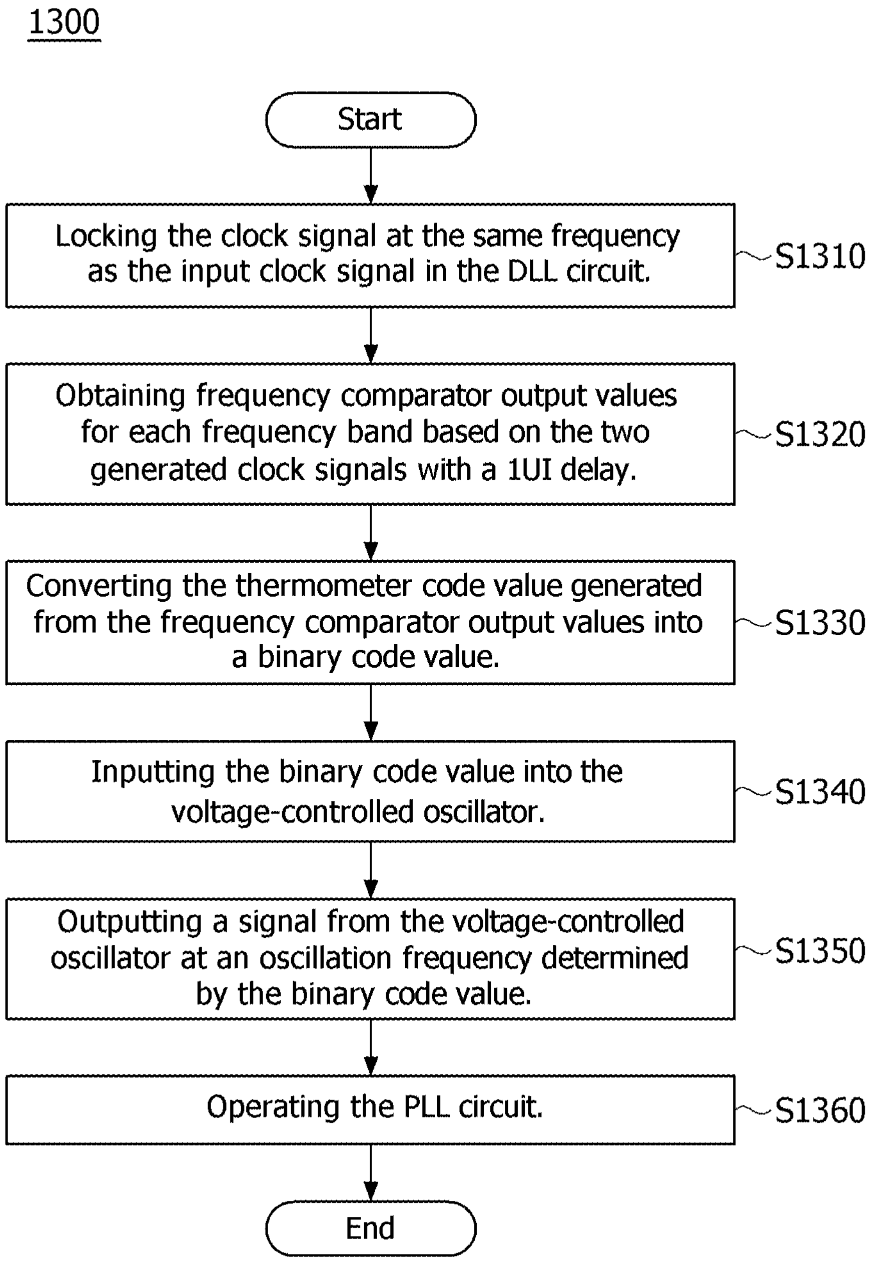
FIG. 13 is a flowchart illustrating the operation of a phase-locked loop circuit according to one aspect of the present disclosure.

FIG. 13 is a flowchart illustrating the operation of the phase-locked loop circuit according to one aspect of the present disclosure.

The method 1300 for operating the phase-locked loop (PLL) circuit according to one aspect of the present disclosure may be as follows:

In step S1310, the delay-locked loop (DLL) circuit 60 may lock the clock signal at the same frequency as the reference clock signal CLK_REF, which is the input signal of the phase-locked loop (PLL) circuit.

In step S1320, the delay-locked loop (DLL) circuit 60 may transmit two clock signals with a 1UI phase difference to the multi-band selector 70. Each frequency comparator 72 in the multi-band selector 70 may apply an individually set delay time Tdelay to the first clock signal (e.g., CK1) to generate a delay clock signal CK_delay. Each frequency comparator 72 may then compare the phase of the delay clock signal with that of the second clock signal (e.g., CK2) and output an output signal Q based on the result of the comparison.

In step S1330, the encoder 74 of the multi-band selector 70 may receive the output signals Q from the frequency comparators 72, generate a thermometer code value COMP_OUT, and convert the thermometer code value into a binary code value BWMODE.

In step S1340, the multi-band selector 70 may output the converted binary code value BWMODE, and the voltage-controlled oscillator 40 may receive the output binary code value.

In step S1350, the voltage-controlled oscillator 40 may output a clock signal with an oscillation frequency determined by the control voltage VCONT within the frequency band corresponding to the received binary code value BWMODE. As a result, the voltage-controlled oscillator 40 may operate with a lower gain.

In step S1360, the phase-locked loop (PLL) circuit may generate and output a restored clock signal based on the signal received from an external device through its normal operation.

Figure 14:
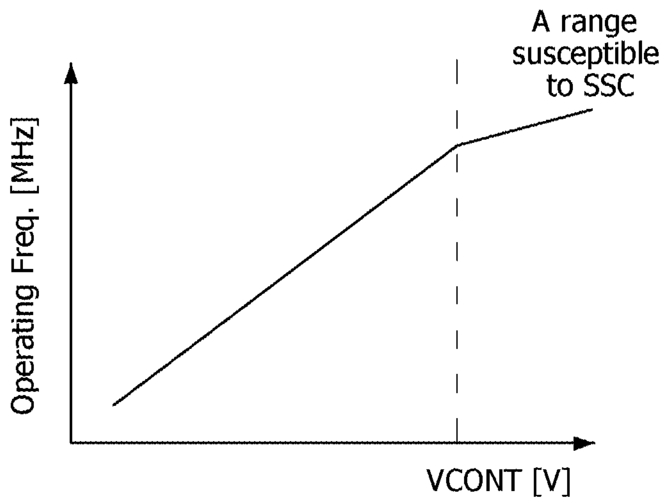
FIG. 14 is a graph illustrating the operating frequency relative to the control voltage in a phase-locked loop circuit according to a related art aspect.
Figure 15:
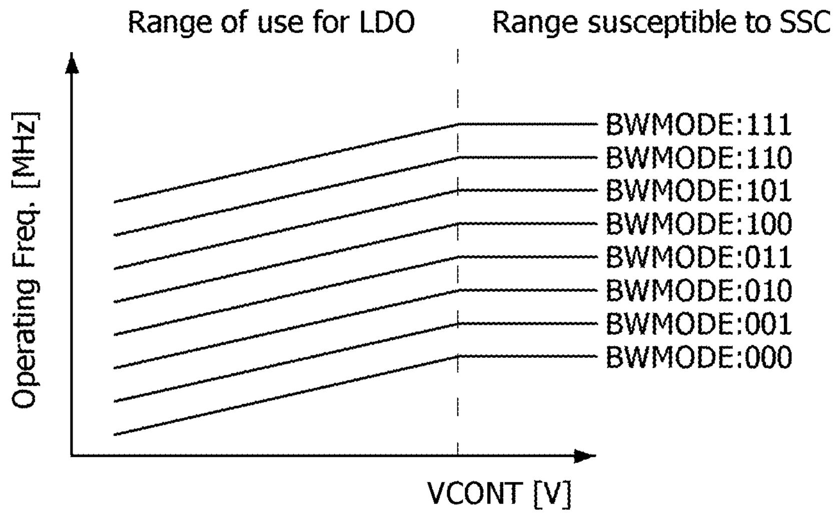
FIG. 15 is a graph illustrating the operating frequency relative to the control voltage in a phase-locked loop circuit according to one aspect of the present disclosure.

FIG. 14 is a graph showing the operating frequency versus the control voltage VCONT in a phase-locked loop circuit according to a related art aspect. FIG. 15 is a graph showing the operating frequency versus the control voltage in a phase-locked loop circuit according to one aspect of the present disclosure.

Referring to FIG. 14, a typical phase-locked loop (PLL) circuit exhibits the characteristic that operating frequency increases linearly with respect to the control voltage VCONT within a certain range. In the range indicated by the right side of the dotted line in FIG. 14, where the control voltage is high, the gain Kvco of the voltage-controlled oscillator 40 may decrease. This reduction in the gain Kvco may lead to a decrease in the loop bandwidth of the phase-locked loop (PLL) circuit, potentially resulting in improper operation of the spread spectrum clock (SSC).

Furthermore, to broaden the operating frequency range of the PLL circuit, the gain Kvco of the voltage-controlled oscillator 40 must increase, causing the slope of the linear graph to increase within the range indicated by the left side of the dotted line of FIG. 14. In this case, the output of the voltage-controlled oscillator 40 becomes susceptible to instability, as even slight variations in the control voltage due to noise transmitted through the power supplied to the PLL circuit may cause significant changes in the oscillation frequency.

In contrast, the phase-locked loop (PLL) circuit according to one aspect of the present disclosure may automatically select the operating frequency band of the voltage-controlled oscillator 40 by controlling it using a binary code value generated based on the reference clock signal CLK_REF, which is an input signal.

Referring to FIG. 15, the phase-locked loop (PLL) circuit may achieve a broader operating frequency range while dividing the frequency range into a plurality of intervals. The gain Kvco of the voltage-controlled oscillator 40 operating in a frequency band within each interval, may be maintained at a lower level. In the range indicated by the left side of the dotted line of FIG. 15, the linear graphs exhibit a smaller slope compared to FIG. 14.

Additionally, even without using the range of control voltage VCONT that is susceptible to spread spectrum clock (SSC) operation, which is a range indicated by the right side of the dotted line of FIG. 15, the PLL circuit may sufficiently output a high oscillation frequency by using a lower control voltage. As a result, the spread spectrum clock (SSC) operation of the phase-locked loop (PLL) circuit may be performed without any problems. Furthermore, in one aspect, a low dropout (LDO) power supply may be used for the low control voltage, thereby enabling the use of a stable control voltage with minimal noise.

As described above, the phase-locked loop circuit and the display driver including the same, according to one aspect of the present disclosure, may generate two clock signals with a 1UI phase difference using the reference clock signal, which is the input signal of the phase-locked loop (PLL) circuit. By associating the two clock signals generated based on the reference clock signal with interval-specific delay times divided by frequency bands and calculating a code value, the operating bandwidth of the voltage-controlled oscillator (VCO) may be automatically selected by selecting the frequency bands based on the calculated code value. Consequently, the phase-locked loop (PLL) circuit may secure a wide operating frequency band while maintaining a low gain for the voltage-controlled oscillator (VCO).

Although the aspects of the present disclosure have been described in more detail with reference to the accompanying drawings, the present disclosure is not necessarily limited to such aspects, and may be variously modified within the scope thereof without departing from the technical spirit of the present disclosure. Therefore, the aspects disclosed in the present disclosure are provided for illustrative purposes only and are not intended to limit the technical concept of the present disclosure, and the scope of the technical concept of the present disclosure is not limited thereto. Therefore, it should be understood that the aspects described above are illustrative in all aspects and do not limit the present disclosure. The scope of protection of the present disclosure should be construed on the basis of the following claims, and all technical concepts within the equivalent scope thereof should be construed as falling within the scope of the present disclosure.

What is claimed is:

1. A phase-locked loop circuit comprising:

a voltage-controlled oscillator configured to output a variable clock signal with an oscillation frequency based on a control voltage; and a bandwidth selection circuit configured to output a binary code value supplied to the voltage-controlled oscillator, wherein the voltage-controlled oscillator outputs the variable clock signal based on a bandwidth selected according to the binary code value, wherein an input signal of the phase-locked loop circuit includes a reference clock signal, and wherein the bandwidth selection circuit includes:

a delay-locked loop circuit configured to lock an internal clock signal using the reference clock signal at the same frequency as the reference clock signal and to output two clock signals having a 1 unit interval (UI) phase difference, wherein the bandwidth selection circuit is configured to determine the binary code value using the two clock signals having the 1UI phase difference and delay times respectively assigned to a plurality of intervals of a predetermined frequency band.

2. The phase-locked loop circuit of claim 1, wherein the two clock signals include a first clock signal and a second clock signal, and wherein the first clock signal leads the second clock signal in phase.

3. The phase-locked loop circuit of claim 2, wherein the bandwidth selection circuit further includes a multi-band selector, and wherein the multi-band selector is configured to:

receive the two clock signals, divide a predetermined frequency band into a plurality of intervals and assign delay times to each interval, and determine the binary code value by comparing a delay clock signal, generated by applying the interval-specific delay time to the first clock signal, with the second clock signal.

4. The phase-locked loop circuit of claim 3, wherein the number of the plurality of intervals is 2 raised to the power of n, where n is a natural number, and wherein the interval-specific delay times are sequentially configured as multiples of the shortest delay time among the interval-specific delay times.

5. The phase-locked loop circuit of claim 3, wherein the multi-band selector is configured to:

determine, for each interval, whether the delay clock signal lags behind the second clock signal in phase, generate a thermometer code value based on the determination result, and convert the thermometer code value into the binary code value.

6. The phase-locked loop circuit of claim 5, wherein the multi-band selector determines, for each interval, that the delay clock signal is 0 if it leads the second clock signal in phase, and the delay clock signal is 1 if it lags behind the second clock signal in phase.

7. A display driver comprising:

a phase-locked loop circuit configured to restore a clock signal based on a signal received from an external device; and a control logic circuit configured to process image data using the restored clock signal, wherein the phase-locked loop circuit includes:

a voltage-controlled oscillator configured to output a variable clock signal with an oscillation frequency based on a control voltage; and a bandwidth selection circuit configured to output a binary code value supplied to the voltage-controlled oscillator, and wherein the voltage-controlled oscillator generates the restored clock signal by outputting the variable clock signal based on a bandwidth selected according to the binary code value, wherein an input signal of the phase-locked loop circuit includes a reference clock signal, and wherein the bandwidth selection circuit includes a delay-locked loop circuit configured to lock an internal clock signal at the same frequency as the reference clock signal using the reference clock signal and to output two clock signals having a 1 unit interval (UI) phase difference, and wherein the bandwidth selection circuit is configured to determine the binary code value using the two clock signals having the 1UI phase difference and delay times respectively assigned to a plurality of intervals of a predetermined frequency band.

8. The display driver of claim 7, wherein the two clock signals include a first clock signal and a second clock signal, and the first clock signal leads the second clock signal in phase.

9. The display driver of claim 8, wherein:

the bandwidth selection circuit further includes a multi-band selector, and the multi-band selector is configured to:

receive the two clock signals, divide a predetermined frequency band into a plurality of intervals and assign delay times to each interval, and determine the binary code value by comparing a delay clock signal, generated by applying the interval-specific delay time to the first clock signal, with the second clock signal.

10. The display driver of claim 9, wherein the number of the plurality of intervals is 2 raised to the power of n, where n is a natural number, and the interval-specific delay times are sequentially configured as multiples of the shortest delay time among the interval-specific delay times.

11. The display driver of claim 9, wherein the multi-band selector is configured to:

determine, for each interval, whether the delay clock signal lags behind the second clock signal in phase, generate a thermometer code value based on the determination result, and convert the thermometer code value into the binary code value.

12. The display driver of claim 11, wherein the multi-band selector is configured to determine, for each interval, that the delay clock signal is 0 if it leads the second clock signal in phase, and the delay clock signal is 1 if it lags behind the second clock signal in phase.

* * * * *